US012690156B2

(12) United States Patent
Frankel et al.

(10) Patent No.: US 12,690,156 B2
(45) Date of Patent: Jul. 21, 2026

(54) SIDE-PLANE CONNECTOR MODULES FOR BLIND-MATE INTERCONNECTION WITH BLADE MODULES

(71) Applicant: Ciena Corporation, Hanover, MD (US)

(72) Inventors: Michael Y. Frankel, Hallandale Beach, FL (US); Daniel Rivaud, Ottawa (CA); Gerard Leo Swinkels, Ottawa (CA); Vladimir Pelekhaty, Baltimore, MD (US)

(73) Assignee: Ciena Corporation, Hanover, MD (US)

( * ) Notice: Subject to any disclaimer, the term of this patent is extended or adjusted under 35 U.S.C. 154(b) by 140 days.

(21) Appl. No.: 18/766,215

(22) Filed: Jul. 8, 2024

(65) Prior Publication Data

US 2026/0013069 A1    Jan. 8, 2026

(51) Int. Cl.
| | |
|---|---|
| *G06F 1/16* | (2006.01) |
| *H05K 5/00* | (2025.01) |
| *H05K 7/00* | (2006.01) |
| *H05K 7/14* | (2006.01) |
| *H05K 7/20* | (2006.01) |

(52) U.S. Cl.
CPC ......... *H05K 7/1492* (2013.01); *H05K 7/1452* (2013.01); *H05K 7/20781* (2013.01)

(58) Field of Classification Search
CPC .............. H05K 7/1492; H05K 7/1452; H05K 7/20781; H05K 7/1491; H05K 7/1488; H05K 7/1485; H05K 7/14; H05K 7/1454; H05K 7/1438; H05K 9/0062
See application file for complete search history.

(56) References Cited

U.S. PATENT DOCUMENTS

| | | | |
|---|---|---|---|
| 4,740,682 | A | 4/1988 | Frankel |
| 4,910,395 | A | 3/1990 | Frankel |
| 5,991,036 | A | 11/1999 | Frankel |
| 6,100,831 | A | 8/2000 | Frankel |
| 6,137,442 | A | 10/2000 | Roman et al. |
| 6,215,592 | B1 | 4/2001 | Pelekhaty |
| 6,243,175 | B1 | 6/2001 | Pelekhaty |
| 6,301,042 | B1 | 10/2001 | Pelekhaty |
| 6,335,562 | B1 | 1/2002 | Dietrich et al. |
| 6,362,759 | B1 | 3/2002 | Biernacki et al. |
| 6,407,863 | B1 | 6/2002 | Archambault et al. |
| 6,430,336 | B1 | 8/2002 | Frankel |
| 6,496,297 | B1 | 12/2002 | Frankel et al. |

(Continued)

*Primary Examiner* — Anthony M Haughton
(74) *Attorney, Agent, or Firm* — Baratta Law PLLC; Lawrence A. Baratta, Jr.

(57) ABSTRACT

Systems and methods are provided for increasing space for external connectors on network components mounted on a rack or cabinet. According to one implementation, a Network Element (NE) assembly includes a blade module having a relatively flat form factor. The blade module, for instance, includes at least a front section, a rear section, a left-side section, and a right-side section. When the blade module is mounted in a rack, the front section thereof is arranged at or near a front portion of the rack and the rear section thereof is arranged at or near a back portion of the rack. Furthermore, the NE assembly further includes a first side-plane connector module configured to be coupled with the left-side section or right-side section of the blade module.

20 Claims, 6 Drawing Sheets

(56) References Cited

U.S. PATENT DOCUMENTS

| | | | |
|---|---|---|---|
| 6,535,682 B1* | 3/2003 | Puetz | G02B 6/44528 |
| | | | 385/137 |
| 6,556,763 B1* | 4/2003 | Puetz | H04Q 1/13 |
| | | | 385/134 |
| 6,765,659 B1 | 7/2004 | Bhatnagar et al. | |
| 6,795,394 B1 | 9/2004 | Swinkels et al. | |
| 6,795,607 B1 | 9/2004 | Archambault et al. | |
| 6,907,201 B1 | 6/2005 | Frankel | |
| 6,944,383 B1* | 9/2005 | Herzog | G02B 6/44526 |
| | | | 439/502 |
| 6,980,738 B1 | 12/2005 | Frankel et al. | |
| 6,996,342 B2 | 2/2006 | Park et al. | |
| 7,184,215 B2 | 2/2007 | Pelekhaty | |
| 7,254,327 B1 | 8/2007 | Zhong et al. | |
| 7,310,318 B1 | 12/2007 | Frankel et al. | |
| 7,343,101 B1 | 3/2008 | Frankel et al. | |
| 7,415,208 B1 | 8/2008 | Haggans et al. | |
| 7,512,343 B2 | 3/2009 | Sridhar et al. | |
| 7,634,194 B2 | 12/2009 | Frankel et al. | |
| 7,646,590 B1* | 1/2010 | Corhodzic | H05K 7/1492 |
| | | | 361/644 |
| 7,693,357 B2 | 4/2010 | Marrakchi El Fellah et al. | |
| 7,853,157 B2 | 12/2010 | Grigoryan et al. | |
| 7,962,049 B2 | 6/2011 | Mateosky et al. | |
| 7,995,569 B2 | 8/2011 | Ashwood-Smith et al. | |
| 8,005,375 B2 | 8/2011 | Frankel | |
| 8,045,855 B2 | 10/2011 | Frankel | |
| 8,085,676 B2 | 12/2011 | Skalecki et al. | |
| 8,166,183 B2 | 4/2012 | Swinkels et al. | |
| 8,184,526 B2 | 5/2012 | Duncan et al. | |
| 8,280,258 B2 | 10/2012 | Frankel | |
| 8,433,192 B2 | 4/2013 | Frankel et al. | |
| 8,553,707 B2 | 10/2013 | Swinkels et al. | |
| 8,582,705 B2 | 11/2013 | Frankel et al. | |
| 8,625,994 B2 | 1/2014 | Archambault et al. | |
| 8,630,315 B2 | 1/2014 | Rivaud et al. | |
| 8,699,880 B2 | 4/2014 | Grigoryan et al. | |
| 8,750,706 B2 | 6/2014 | Boertjes et al. | |
| 8,776,161 B2 | 7/2014 | Gazier et al. | |
| 8,787,771 B2 | 7/2014 | Frankel | |
| 8,798,455 B2 | 8/2014 | Frankel | |
| 8,817,798 B2 | 8/2014 | Skalecki et al. | |
| 8,879,904 B1 | 11/2014 | Harley et al. | |
| 8,884,649 B1 | 11/2014 | Mateosky et al. | |
| 8,908,745 B2 | 12/2014 | Pelekhaty et al. | |
| 8,977,125 B2 | 3/2015 | Grigoryan et al. | |
| 8,983,293 B2 | 3/2015 | Frankel et al. | |
| 9,077,474 B2 | 7/2015 | Boertjes et al. | |
| 9,118,421 B2 | 8/2015 | Swinkels et al. | |
| 9,124,960 B2 | 9/2015 | Swinkels et al. | |
| 9,191,117 B2 | 11/2015 | Alexander et al. | |
| 9,191,280 B2 | 11/2015 | Skalecki et al. | |
| 9,197,355 B2 | 11/2015 | Swinkels et al. | |
| 9,207,461 B2 | 12/2015 | Frankel et al. | |
| 9,232,678 B2* | 1/2016 | Bailey | H05K 7/1492 |
| 9,258,190 B2 | 2/2016 | Swinkels et al. | |
| 9,270,405 B2 | 2/2016 | Blair et al. | |
| 9,320,166 B1* | 4/2016 | Marr | H05K 7/14 |
| 9,357,278 B2 | 5/2016 | Swinkels et al. | |
| 9,374,166 B2 | 6/2016 | Frankel et al. | |
| 9,407,359 B2 | 8/2016 | Swinkels et al. | |
| 9,419,725 B2 | 8/2016 | Grigoryan et al. | |
| 9,438,370 B2 | 9/2016 | Swinkels et al. | |
| 9,509,410 B2 | 11/2016 | Mateosky et al. | |
| 9,515,767 B2 | 12/2016 | Frankel et al. | |
| 9,628,172 B2 | 4/2017 | Prakash et al. | |
| 9,667,570 B2 | 5/2017 | Swinkels et al. | |
| 9,756,405 B2 | 9/2017 | Swinkels et al. | |
| 9,800,325 B1 | 10/2017 | Swinkels et al. | |
| 9,800,522 B2 | 10/2017 | Chhillar et al. | |
| 9,819,586 B2 | 11/2017 | Swinkels et al. | |
| 9,832,548 B2 | 11/2017 | Swinkels et al. | |
| 9,835,880 B2 | 12/2017 | Frankel et al. | |
| 9,836,931 B1 | 12/2017 | Gazier et al. | |
| 9,838,763 B2 | 12/2017 | Asselin et al. | |
| 9,843,439 B2 | 12/2017 | Rivaud et al. | |
| 9,847,752 B2 | 12/2017 | Rivaud et al. | |
| 9,906,294 B2 | 2/2018 | Al Sayeed et al. | |
| 10,012,811 B2 | 7/2018 | Rivaud et al. | |
| 10,039,206 B1* | 7/2018 | Wishman | H05K 7/1492 |
| 10,110,423 B2 | 10/2018 | Skalecki et al. | |
| 10,141,926 B2 | 11/2018 | Pelekhaty et al. | |
| 10,142,092 B2 | 11/2018 | Frankel et al. | |
| 10,194,221 B2 | 1/2019 | Frankel et al. | |
| 10,200,305 B2 | 2/2019 | Pelekhaty et al. | |
| 10,239,749 B2 | 3/2019 | Frankel et al. | |
| 10,247,895 B2 | 4/2019 | Estabrooks et al. | |
| 10,263,609 B2 | 4/2019 | Estabrooks et al. | |
| 10,274,682 B2 | 4/2019 | Frankel et al. | |
| 10,291,001 B2* | 5/2019 | Robertson | H02B 1/36 |
| 10,313,014 B2 | 6/2019 | Pelekhaty et al. | |
| 10,313,021 B1 | 6/2019 | Frankel et al. | |
| 10,334,539 B2 | 6/2019 | Clarke et al. | |
| 10,341,258 B2 | 7/2019 | Sareen et al. | |
| 10,404,365 B2 | 9/2019 | Frankel et al. | |
| 10,425,322 B2 | 9/2019 | Blair et al. | |
| 10,476,815 B2 | 11/2019 | Pelekhaty et al. | |
| 10,541,923 B2 | 1/2020 | Skalecki et al. | |
| 10,674,241 B2 | 6/2020 | Duncan et al. | |
| 10,715,888 B2 | 7/2020 | Swinkels et al. | |
| 10,736,227 B1 | 8/2020 | Rivaud et al. | |
| 10,824,551 B2 | 11/2020 | Woods et al. | |
| 10,855,623 B2 | 12/2020 | Estabrooks et al. | |
| 10,924,324 B2 | 2/2021 | Duncan et al. | |
| 11,079,559 B2 | 8/2021 | Leclair et al. | |
| 11,121,984 B2 | 9/2021 | Frankel et al. | |
| 11,196,504 B1 | 12/2021 | Frankel et al. | |
| 11,283,524 B2 | 3/2022 | Frankel et al. | |
| 11,388,492 B2 | 7/2022 | Frankel et al. | |
| 11,506,845 B2 | 11/2022 | Rivaud et al. | |
| 11,547,011 B2* | 1/2023 | Teeter | H05K 7/1492 |
| 11,553,259 B2 | 1/2023 | Boertjes et al. | |
| 11,563,486 B2 | 1/2023 | Swinkels et al. | |
| 11,563,687 B2 | 1/2023 | Frankel et al. | |
| 11,711,270 B1 | 7/2023 | Pelekhaty et al. | |
| 11,785,365 B2 | 10/2023 | Swinkels et al. | |
| 11,799,549 B2 | 10/2023 | Frankel et al. | |
| 2004/0062472 A1 | 4/2004 | Frankel et al. | |
| 2005/0094252 A1 | 5/2005 | Haggans et al. | |
| 2005/0100271 A1 | 5/2005 | Frankel | |
| 2006/0127086 A1 | 6/2006 | Frankel | |
| 2006/0139742 A1 | 6/2006 | Frankel et al. | |
| 2007/0025730 A1 | 2/2007 | Frankel | |
| 2007/0081247 A1 | 4/2007 | Pelekhaty | |
| 2007/0166032 A1 | 7/2007 | Frankel | |
| 2007/0264024 A1 | 11/2007 | Zheng et al. | |
| 2008/0018990 A1 | 1/2008 | Sridhar et al. | |
| 2008/0144293 A1* | 6/2008 | Aksamit | H05K 7/1489 |
| | | | 29/428 |
| 2009/0103931 A1 | 4/2009 | Grigoryan et al. | |
| 2010/0329694 A1 | 12/2010 | Frankel | |
| 2011/0033195 A1 | 2/2011 | Frankel | |
| 2012/0183092 A1 | 7/2012 | Pelekhaty et al. | |
| 2013/0007230 A1 | 1/2013 | Skalecki et al. | |
| 2013/0223036 A1* | 8/2013 | Herring | H05K 7/1451 |
| | | | 439/502 |
| 2013/0290111 A1 | 10/2013 | Frankel | |
| 2014/0064102 A1 | 3/2014 | Frankel et al. | |
| 2014/0112123 A1 | 4/2014 | Holness et al. | |
| 2014/0369686 A1 | 12/2014 | Pelekhaty et al. | |
| 2015/0043553 A1 | 2/2015 | Swinkels et al. | |
| 2015/0075957 A1 | 3/2015 | Frankel | |
| 2015/0296666 A1* | 10/2015 | Soo Hoo | H05K 7/1491 |
| | | | 361/818 |
| 2015/0304159 A1 | 10/2015 | Sharma et al. | |
| 2016/0034761 A1 | 2/2016 | Berthold et al. | |
| 2016/0049964 A1 | 2/2016 | Mateosky et al. | |
| 2016/0124470 A1* | 5/2016 | Leigh | H01H 23/12 |
| | | | 361/679.58 |
| 2016/0357033 A1 | 12/2016 | Frankel et al. | |
| 2016/0380880 A1 | 12/2016 | Swinkels et al. | |
| 2017/0122812 A1 | 5/2017 | Bhatnagar et al. | |
| 2017/0127157 A1 | 5/2017 | Frankel et al. | |
| 2017/0336903 A1 | 11/2017 | Rivaud et al. | |

(56) References Cited

U.S. PATENT DOCUMENTS

| | | |
|---|---|---|
| 2018/0026632 A1 | 1/2018 | Frankel et al. |
| 2018/0077080 A1 | 3/2018 | Gazier et al. |
| 2018/0123980 A1 | 5/2018 | Frankel et al. |
| 2018/0131776 A1 | 5/2018 | Skalecki et al. |
| 2018/0262421 A1 | 9/2018 | Skalecki et al. |
| 2018/0309236 A1* | 10/2018 | Leigh .................. G02B 6/3895 |
| 2019/0097728 A1 | 3/2019 | Frankel et al. |
| 2019/0174211 A1 | 6/2019 | Swinkels et al. |
| 2019/0182180 A1 | 6/2019 | Frankel et al. |
| 2019/0215586 A1 | 7/2019 | Swinkels et al. |
| 2019/0326992 A1 | 10/2019 | Charlton et al. |
| 2019/0327188 A1 | 10/2019 | Rivaud et al. |
| 2020/0162172 A1 | 5/2020 | Sridhar et al. |
| 2020/0236064 A1 | 7/2020 | Frankel et al. |
| 2021/0075746 A1 | 3/2021 | Frankel |
| 2021/0176542 A1 | 6/2021 | Frankel et al. |
| 2021/0210894 A1 | 7/2021 | Rivaud et al. |
| 2021/0243915 A1 | 8/2021 | Saturley et al. |
| 2021/0367674 A1 | 11/2021 | Leclair et al. |
| 2022/0038391 A1 | 2/2022 | Frankel et al. |
| 2022/0075114 A1 | 3/2022 | Frankel et al. |
| 2022/0115844 A1 | 4/2022 | Shearman et al. |
| 2022/0200908 A1 | 6/2022 | Rivaud et al. |
| 2022/0209868 A1 | 6/2022 | Frankel et al. |
| 2022/0261686 A1 | 8/2022 | Frankel et al. |
| 2022/0308299 A1 | 9/2022 | Rivaud et al. |
| 2023/0010285 A1 | 1/2023 | Rivaud et al. |
| 2023/0039781 A1 | 2/2023 | Mohajer et al. |
| 2023/0047613 A1 | 2/2023 | Frankel et al. |
| 2023/0088207 A1 | 3/2023 | Shearman et al. |
| 2023/0125468 A1 | 4/2023 | Campbell et al. |
| 2023/0189482 A1 | 6/2023 | Rivaud et al. |
| 2023/0232138 A1 | 7/2023 | Rivaud et al. |
| 2023/0260375 A1 | 8/2023 | Rivaud et al. |
| 2023/0261899 A1 | 8/2023 | Colton et al. |
| 2023/0308182 A1 | 9/2023 | Frankel et al. |
| 2023/0412277 A1 | 12/2023 | Frankel et al. |
| 2024/0049434 A1 | 2/2024 | Mohajer et al. |
| 2024/0061169 A1 | 2/2024 | Frankel et al. |
| 2024/0113747 A1 | 4/2024 | Frankel et al. |
| 2024/0179877 A1 | 5/2024 | Rivaud et al. |

* cited by examiner

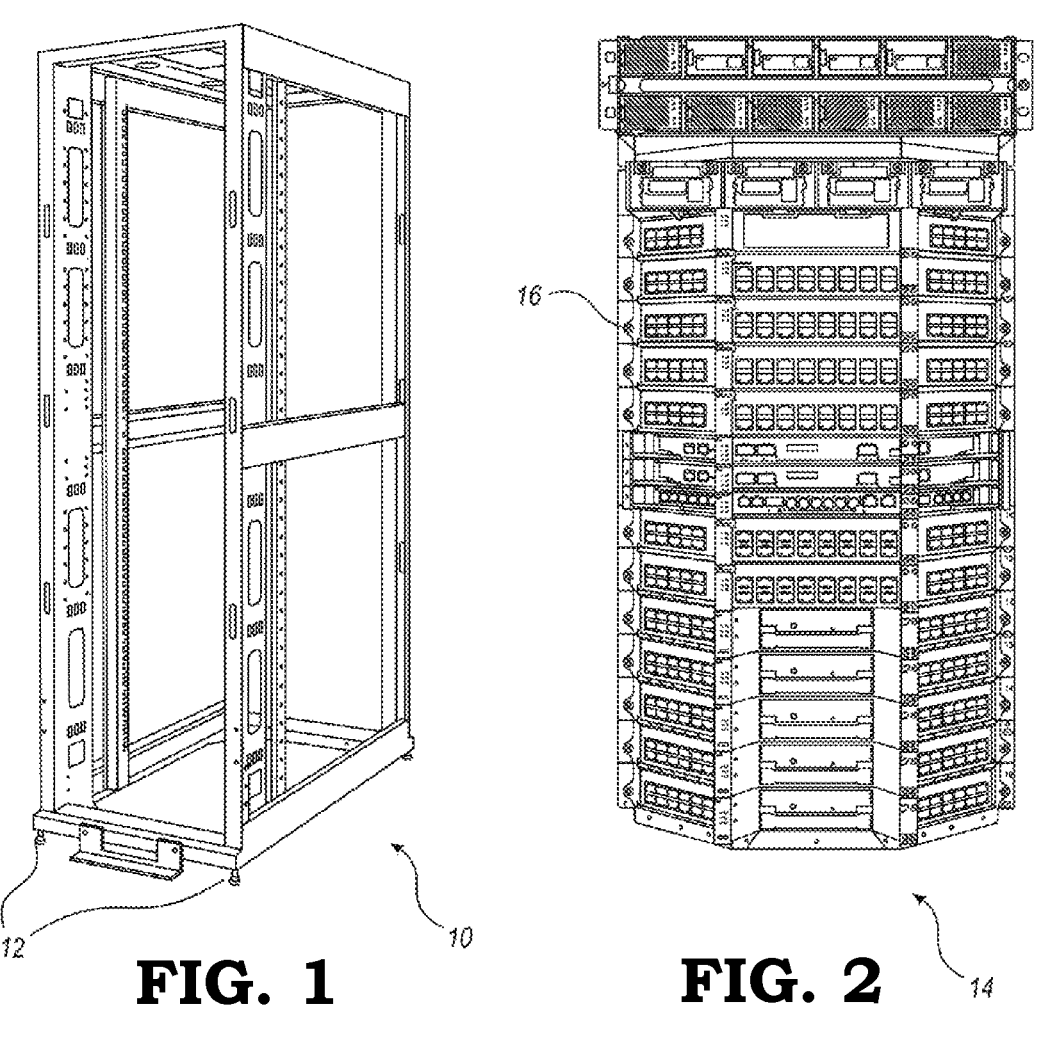
FIG. 1
FIG. 2
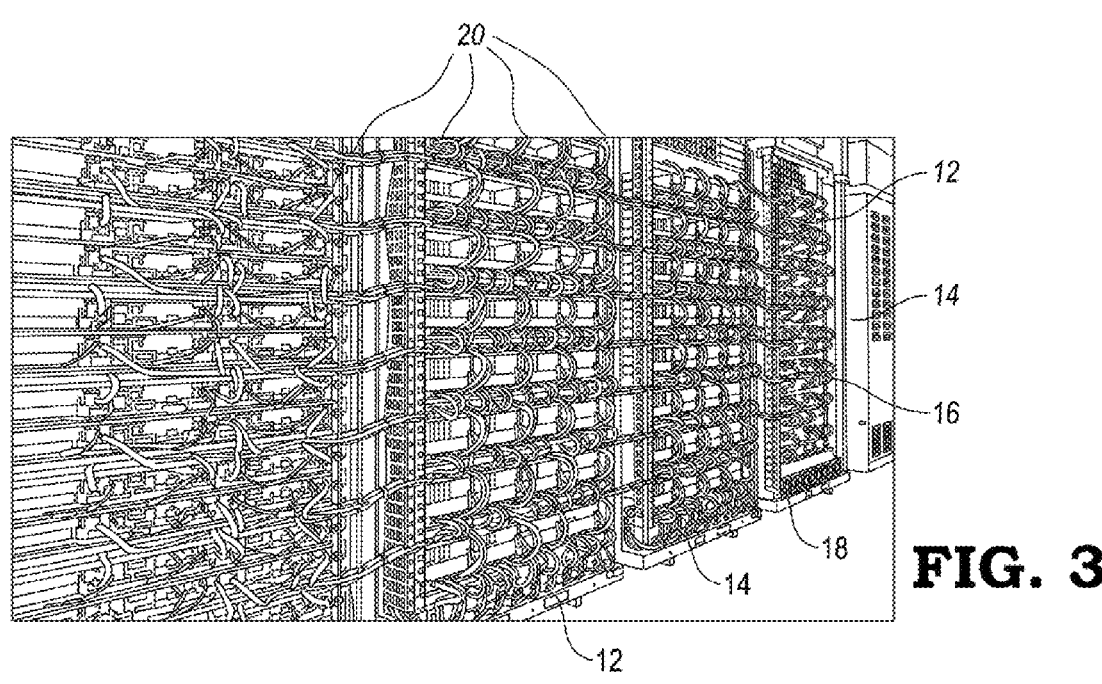
FIG. 3

SPINE BLADES 101  BLADE 1 100A  BLADE 2 100B  BLADE 3 100C  BLADE 4 100D  100

EBO Connector 64 FPs

EBO Connector 64 FPs

FIBER CABLE 1-1: 256 FPS

*** REPEATS 8 TIMES
WITH EBO cross-LINKS
EBO 12 – EBO21
EBO22 – EBO22
EBO13 – EBO31
etc...

LEAF BLADES    Blade 1 110A  Blade 2 110B  Blade 3 110C  Blade 4 110D

120

LEAF RACK                    SPINE RACK

BLADE 1
BLADE 2

EBO CONNECTOR
(64 FPS EACH)

BLADE 16
REPEATS TO 32 BLADES        REPEATS TO 32 BLADES

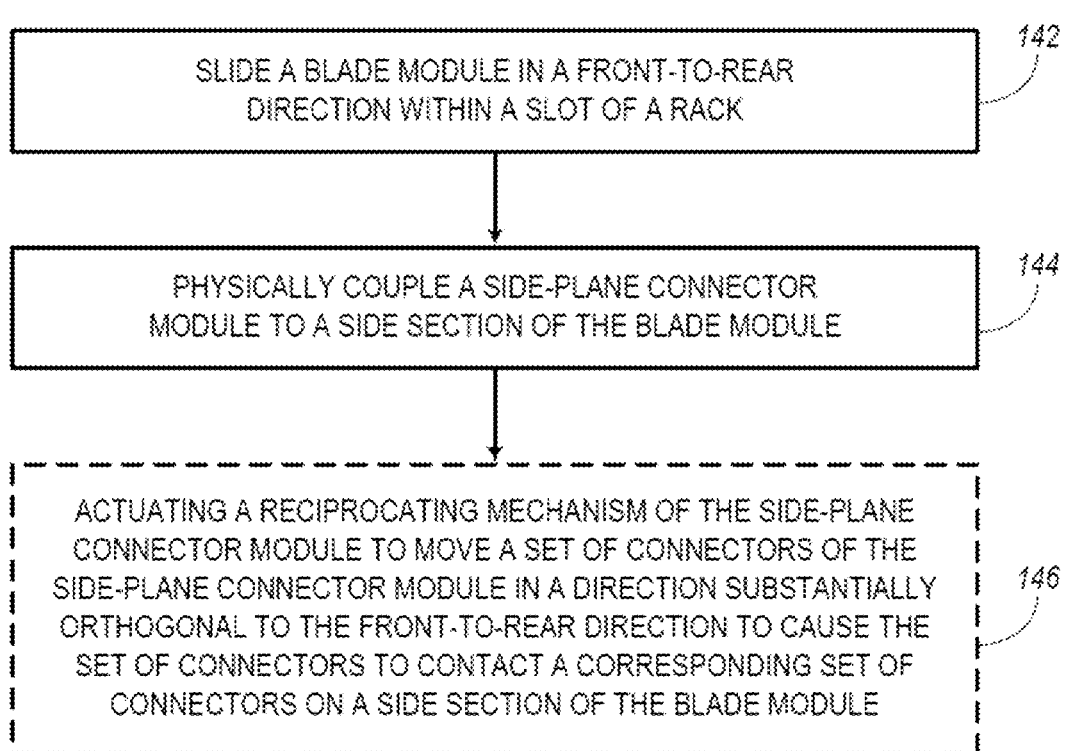

*140*

*142*

SLIDE A BLADE MODULE IN A FRONT-TO-REAR
DIRECTION WITHIN A SLOT OF A RACK

*144*

PHYSICALLY COUPLE A SIDE-PLANE CONNECTOR
MODULE TO A SIDE SECTION OF THE BLADE MODULE

*146*

ACTUATING A RECIPROCATING MECHANISM OF THE SIDE-PLANE
CONNECTOR MODULE TO MOVE A SET OF CONNECTORS OF THE
SIDE-PLANE CONNECTOR MODULE IN A DIRECTION SUBSTANTIALLY
ORTHOGONAL TO THE FRONT-TO-REAR DIRECTION TO CAUSE THE
SET OF CONNECTORS TO CONTACT A CORRESPONDING SET OF
CONNECTORS ON A SIDE SECTION OF THE BLADE MODULE

FIG. 11

SIDE-PLANE CONNECTOR MODULES FOR BLIND-MATE INTERCONNECTION WITH BLADE MODULES

FIELD OF THE DISCLOSURE

The present disclosure generally relates to communication networks and data centers. More particularly, the present disclosure relates to Network Elements (NEs) having blade modules in a Data Center and side-plane connector modules for blind-mate interconnection with the blade modules, utilizing the sides of the blade modules to overcome real estate limitations.

BACKGROUND

Communication networks continue to experience rapid growth with respect to data traffic, bandwidth capabilities, network infrastructures, Artificial Intelligence (AI) applications, cloud computing, Data Center architectures, electrical and/or optical network components, port counts, memory capabilities, etc. In a Data Center, a Leaf-Spine architecture may include Top of Rack (TOR) switches connected to a leaf switching layer, which in turn may be connected to a top spine switching layer. In some cases, the number of cables, e.g., optical fibers, connecting the leaf layer to the spine layer may exceed thousands to hundreds of thousands. Therefore, the task of manually connecting these optical fibers can be challenging and time-consuming for an installer. Further there is limited real estate on the front and rear portions of conventional rack mounted Network Elements (NEs) for optical fiber connections. Of note, while referred to as optical fiber connections, there can also be electrical connections (e.g., Active Electrical Cables (AEC)), as well as combinations of electrical and optical connections.

BRIEF SUMMARY

According to various implementations of the present disclosure, rack-mounted Network Element (NE) assemblies are described. In one implementation a NE assembly includes a blade module having a relatively flat form factor. For example, the blade module may include at least a front section, a rear section, a left-side section, and a right-side section. When the blade module is mounted in a rack, the front section thereof is arranged at or near a front portion of the rack and the rear section thereof is arranged at or near a back portion of the rack. The NE assembly may also include a first side-plane connector module configured to be coupled with the left-side section or right-side section of the blade module. That is, the present disclosure incorporates connections to the sides of the blade module, as opposed to or in addition to front and/or rear connections.

In some embodiments, the NE assembly may further include a second side-plane connector module, wherein the first side-plane connector module is configured to be coupled with the left-side section of the blade module and the second side-plane connector module is configured to be coupled with the right-side section of the blade module. When coupled with the blade module, the first side-plane connector module may be configured to extend beyond a left-side portion of the rack and the second side-plane connector module may be configured to extend beyond a right-side portion of the rack.

The blade module may further include a first set of connectors arranged in the left-side section thereof and a second set of connectors arranged in the right-side section thereof. The first set of connectors is configured for connection with a first corresponding set of connectors of the first side-plane connector module and the second set of connectors is configured for connection with a second corresponding set of connectors of the second side-plane connector module. The NE assembly may further include an alignment structure for aligning the first corresponding set of connectors of the first side-plane connector module with the first set of connectors of the blade module when the first side-plane connector module is being coupled with the blade module and for aligning the second corresponding set of connectors of the second side-plane connector module with the second set of connectors of the blade module when the second side-plane connector module is being coupled with the blade module.

The first and second side-plane connector modules may each further include an additional set of connectors configured for connection with a plurality of external fiber optic cables, wherein the additional sets of connectors are configured to communicate with the corresponding sets of connectors via optical fibers within a housing of the respective side-plane connector module. The various connectors may be configured for connection using blind-mate connections, Multi-fiber Push Ons (MPOs), and/or Expanded Beam Optics (EBO) connections. The first set of connectors and the first corresponding set of connectors are connected in a given structure such that an external cable from the first side-plane connector module connected to a connector of the first set of connectors supports the given structure for connectivity to another NE assembly.

The first and second side-plane connector modules may each include a reciprocating mechanism. When the respective side-plane connector module is coupled with the left-side section or right-side section of the blade module, the reciprocating mechanism is configured to extend the connectors toward the blade module or retract them away from the blade module. In some embodiments, the reciprocating mechanism may include a crank and a gear assembly. For example, the crank may be arranged at a front portion of the respective side-plane connector module for easy access by an installer.

According to additional implementations, the blade module may further include an enclosure that houses one or more of optical circuit switches, Application-Specific Integrated Circuits (ASICs), Graphical Processing Units (GPUs), Central Processing Units (CPUs), and Tensor Processing Units (TPUs). The blade module may include a pizza box configuration and may fit within one Rack Unit (1 RU) of the rack. The blade module may be configured as a Network Element (NE), an Internet switch, a router, a computing system, a server, a rack server, a blade server, an Ethernet blade, a leaf blade, or a spine blade. In some embodiments, the NE assembly may further include a shared blade enclosure configured to be mounted on the rack, wherein the shared blade enclosure includes a plurality of slots configured to slidably accommodate a plurality of blade modules. The rack, for instance, may be arranged in a data center having a plurality of other racks.

In some embodiments, the blade module may further include a set of front connectors arranged in the front section and configured for connection with a plurality of pluggable modules. The front section of the blade module, in some implementations, may include three face panels or some other number of panels oriented at different angles with respect to each other. The NE assembly, along with other NE assemblies mounted on a single rack, may further include a liquid cooling system arranged near the rear section. The blade module may also include a set of rear connectors arranged in the rear section and configured for connection with intra-rack fiber optic cables and/or inter-rack fiber optic cables.

BRIEF DESCRIPTION OF THE DRAWINGS

The present disclosure is illustrated and described herein with reference to the various drawings, in which like reference numbers are used to denote like system components/method steps, as appropriate, and in which:

FIG. 1 is a diagram illustrating an empty rack configured for supporting a plurality of Network Elements (NEs) or blades in a data center, according to various embodiments.

FIG. 2 is a diagram illustrating a plurality of NEs or blades mounted in a rack, according to various embodiments.

FIG. 3 is a view of interconnections among a plurality of NEs or blades on a plurality of racks in a data center, according to various embodiments.

FIG. 11 is a flow diagram illustrating a process for installing a NE assembly on a rack, according to various embodiments.

DETAILED DESCRIPTION

Figure 4:
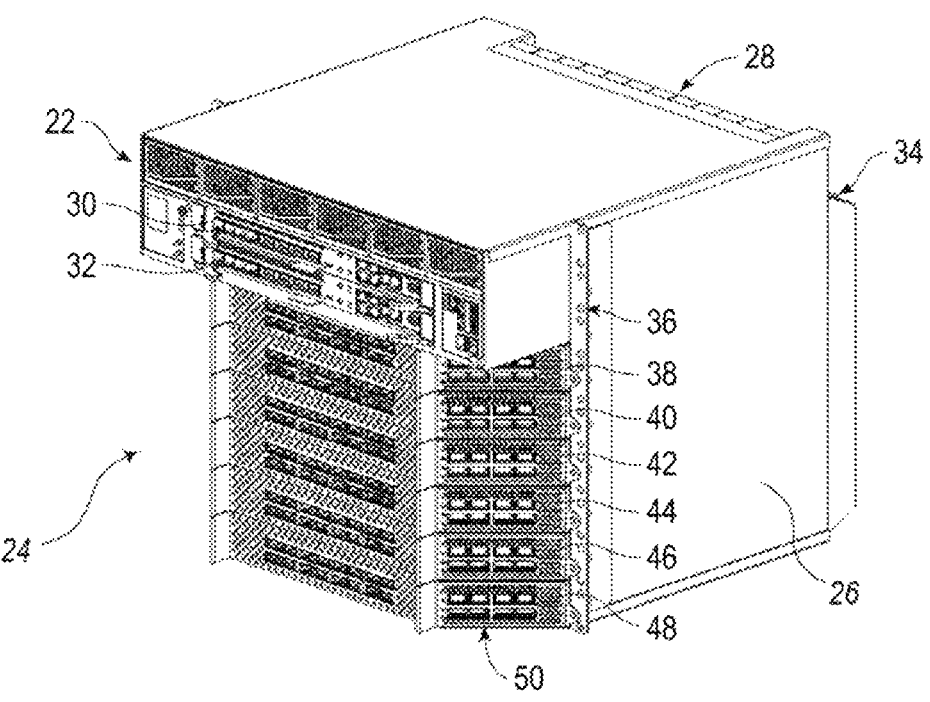
FIG. 4 is a diagram illustrating an isometric view of a front portion of a plurality of NEs or blades mounted on a rack, according to various embodiments.

The present disclosure relates to Data Center architectures and other network systems having rack-mounted Network Elements (NEs), network components, and other types of equipment. As networks and Data Centers scale, the number of internal Leaf/Spine links and fibers or electrical connections can wreak havoc on cable management strategies. At times, it can be infeasible to build a large-scale Leaf/Spine network with manual management of thousands, or even hundreds of thousands, of individual fibers interconnecting end points in a cross-linked configuration. This can also apply to other types of networking, computing, and/or storage devices, i.e., the present disclosure is not limited to NEs in Leaf/Spine, but to any device having a large number of connections cabled thereto.

From the perspective of a technician looking at the back of a rack, the back sections of rack-mounted NEs usually include many connectors for intra-rack and inter-rack mesh network connectivity, as well as a backplane. Not only do the backs of racks include multiple connectors and optical fiber cables, but also liquid cooling systems can be deployed on the backs of these racks to keep the mounted NEs from overheating. Thus, the introduction of liquid cooling systems for accommodating high thermal power dissipation greatly limits the physical space allocated to the complex interconnection system. In addition, from the perspective of looking at the front portions of the racks and NEs, additional types of connectors may be used for accommodating pluggable networking modules (often referred to as "pluggables") that can be easily accessed from the front of the rack.

Some solutions with respect to connector design for various types of NEs may include the use of blind-mate connections, whereby connecting a fiber optic cable to the connector may include a connection that is made by a simple snap-on or plug-in type of action and where no tools are needed. Also, blind-mate connections typically include self-alignment structure for properly aligning the fibers. Again, those skilled in the art will appreciate while the description herein references to fibers, optical fibers, optical cables, etc., the present disclosure also contemplates use with electrical connections, as well as a combination of electrical and optical connections.

Therefore, conventional rack-mounted network elements typically include multiple connectors on the front of the NE as well as multiple connectors on a back of the NE. When the NE is mounted on the rack, a technician can access the front of the component for connecting or disconnecting pluggables, as needed, and may also go behind a row of racks, if accessible, to access the backs of the components for connecting and disconnecting fiber optic cables.

According to the embodiments of the present disclosure, however, new strategies for implementing NEs and new strategies for arranging racks (e.g., in a Data Center) are proposed. In particular, known solutions provide interconnect placement on front and back panels only, which can lead to a number of problems, such as limited space, obstructed airflow, difficult cabling access, manual removal of front-panel plugs for replacement, etc. The embodiments of the present disclosure are configured to overcome the limited space problem of the conventional systems and instead introduce NEs in which additional connectors can also be incorporated in the side panels as well, thereby allowing connections and optical fibers to be oriented in more than just the front and rear portions.

Data Center Racks and Mounted Network Elements (NEs)

FIG. 1 is a diagram illustrating an example of a rack 10 (e.g., cabinet, shelf, chassis, etc.) configured for supporting one or more NEs or "blades" in a Data Center, node, network hub, etc. In some embodiments, a Data Center may include thousands of racks. As illustrated in FIG. 1, the rack 10 is shown in an empty state before any NEs have been mounted. It may be noted that the rack 10 may be used to accommodate conventional NEs as well as the novel NEs (described in the present disclosure as having connectivity on more than just the front and back sides). The rack 10 may include wheels 12 to allow an installer or technician to easily move the rack 10 across a floor of a Data Center, as needed. In some embodiments, the rack 10 may be about 19 inches (or about 24 inches) wide, about 42 inches deep, about 74 inches tall, and may include 30 to 40 Rack Units (RU) each having a height of about 1.75 inches.

FIG. 2 is a diagram illustrating an embodiment of an example NE 14 mounted on a rack (not shown), such as the rack 10 of FIG. 1. The NE 14 may be configured with a plurality of blades each having a height of about 2 RU, although other sizes of NEs can be used having any height (e.g., blade components having a height of 1 RU). The NE 14 may be self-contained with network components within a housing or enclosure and/or may include Printed Circuit Boards (PCBs) with electrical and optical components in a "blade" module format that does not necessarily include a total enclosure housing the components. As described herein, the term blade or blade module is used herein and those skilled in the art will appreciate terms such as module, card, line card, and the like have similar meanings. The NE 14 can be a high-capacity packet switch, such as used in a Leaf/Spine Data Center network. As is seen in FIG. 2, there are a significant number of ports 16 on the front of the NE 14. To further increase the real estate for the ports 16, the NE 14 has angled faceplates on the front, thereby providing more surface area. However, there is a limit to the amount of increase in surface area on the front for supporting the ports 16.

FIG. 3 is a picture showing an example of a view of interconnections 20 among a plurality of NEs or blades on a plurality of racks in a Data Center. For example, the view of FIG. 3 may show the interconnections 20 as optical fibers connected to the fronts of the NEs and blades. The interconnections 20 may be used for computer towers, GPU chips, server clusters, etc. Again, considering the complexity of interconnections 20 caused by the vast number of fibers and limited space, the present disclosure attempts to alleviate these problems of the conventional systems in which only the front and back portions of NEs are used for interconnectivity. Specifically, the present disclosure provides an approach that improves cabling significantly versus conventional approaches as well as using more space to alleviate the real estate issues on the front.

Increasing the Front Section Real Estate of NEs

FIG. 4 is an isometric view showing an example of a plurality of blades 24 mounted on shared blade enclosure 26. In this embodiment, the shared blade enclosure 26 may be connected to a rack (e.g., rack 10). The shared blade enclosure 26 may include a plurality of slots, wherein each may be configured to receive a blade 24. Again, the blade 24 (or NE), according to some embodiments, may include a modular assembly having electrical and optical components mounted on a base plate or PCB where there is not complete enclosure or housing around the electrical and optical components.

Figure 5:
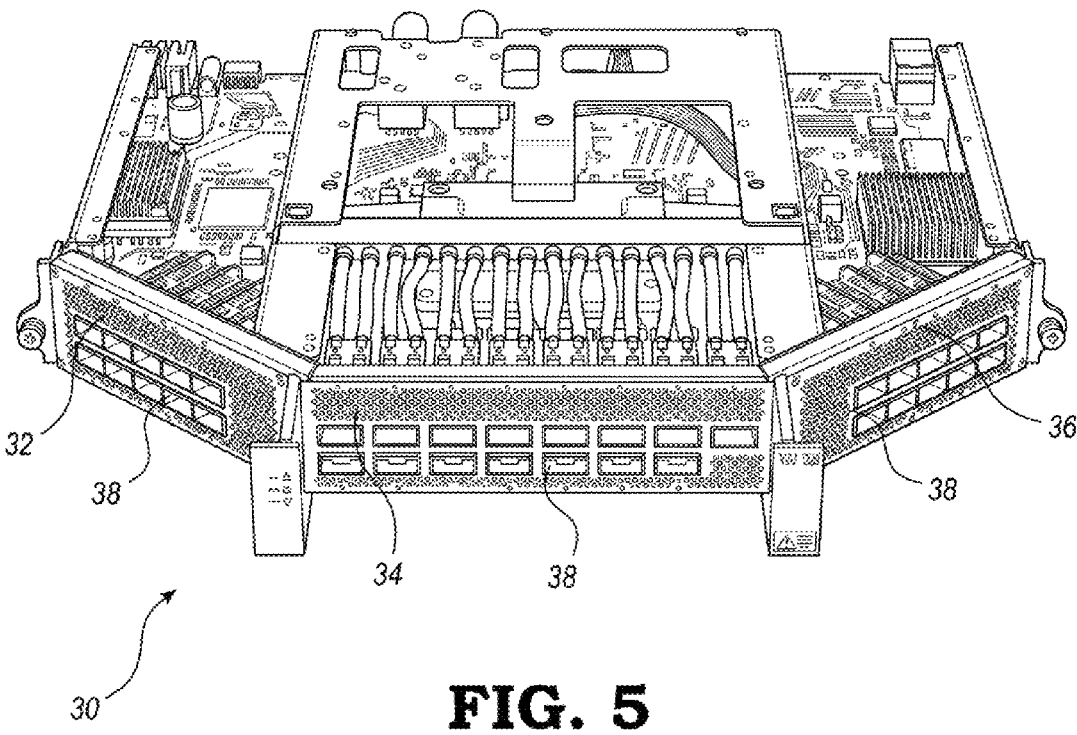
FIG. 5 is a diagram illustrating a front perspective view of one of the blades shown in FIG. 4, according to various embodiments.

FIG. 5 is a front perspective view showing an example of a blade 30. In this embodiment, the blade 30 includes an open arrangement (e.g., without a self-contained housing). Many of the internal components of the blade 30 are shown in FIG. 5. Also, the blade 30 includes three face plates 32, 34, 36 arranged at a front section thereof. The face plates 32, 34, 36 may be oriented at different angles to thereby include a front surface area that allows for a greater number of front-facing connectors 38. The aspect of the angled faceplate slightly increases the real estate for ports. The connectors 38, for example, may be configured to accommodate various types of pluggables based on various network designs.

NE Assembly with Connectable Modules

Figure 6:
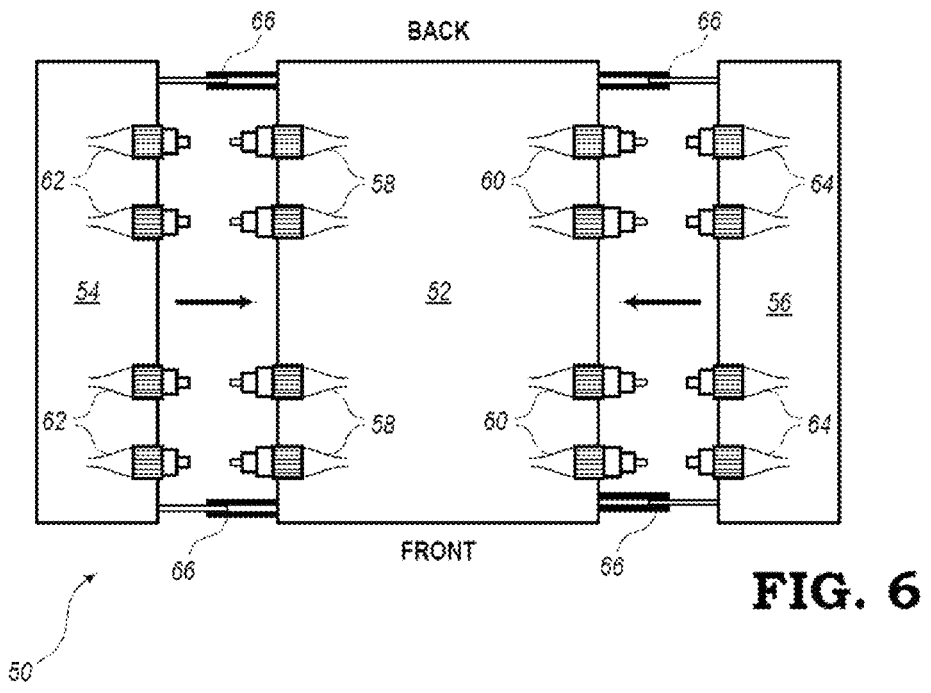
FIG. 6 is a diagram illustrating a top view of a NE having a blade module and two side-panel connector modules, according to various embodiments.

FIG. 6 is a diagram illustrating a top view of an embodiment of a NE assembly 50. Specifically, FIG. 6 is a view looking down on a rack containing the NE assembly 50, i.e., as if the view was looking down from the ceiling. As shown in this embodiment, the NE assembly 50 includes a blade module 52, first side-panel connector module 54, and a second side-panel connector module 56. Not only may the blade module 52 have connectors arranged at the front and back sections thereof (not shown), similar to conventional arrangements, but also the blade module 52 includes a first set of connectors 58 on a left section thereof and/or a second set of connectors 60 on a right section thereof. The first set of connectors 58 may be configured to contact or connect with a corresponding set of connectors 62 of the first side-panel connector module 54. Also, the second set of connectors 60 may be configured to contact or connect with a corresponding set of connectors 64 of the second side-panel connector module 56.

Furthermore, the first and second side-panel connector modules 54, 56 may each include optical fibers and/or electrical cables (not shown) extending from the corresponding sets of connectors 62, 64, respectively. Again, those skilled in the art will appreciate the use of the term optical fibers is for illustrative purposes and the first and second side-panel connector modules 54, 56 may also support electrical cables. Also, the optical fibers may also be connected with additional sets of connectors (not shown), which be fixed to an opposite plate of the respective side-panel connector module 54, 56, a back plate thereof, a front plate thereof, a top plate thereof, and/or a bottom plate thereof. In other embodiments, the optical fibers may include additional connectors that can be moved freely (i.e., floating) and not fixed to the structure of the respective side-panel connector modules 54, 56. In this arrangement, the first and second side-panel connector modules 54, 56 may be configured to provide additional interconnectivity possibilities for various network arrangements. Generally, the first and second side-panel connector modules 54, 56 are configured to support blind-mate connectivity to the sides of the blade module 52 and to route the connections out a front of the first and second side-panel connector modules 54, 56, in bulk cables.

In addition, the NE assembly 50 may further include alignment mechanisms 66 for aligning the first and second side-panel connector modules 54, 56 with the blade module 52. For example, the alignment mechanisms 66 may include protrusions and alignment rails in any suitable combinations. Thus, after the blade module 52 has been mounted on a rack, then the each of the first and second side-panel connector modules 54, 56 can be physically coupled with the blade module 52 using any suitable coupling mechanisms, which may also include the alignment mechanisms 66. In some embodiments, the first and second side-panel connector modules 54, 56 may extend beyond the bounds of the rack on the left and right sides. In particular, the alignment mechanisms 66 may be configured to align the corresponding set of connectors 62 of the first side-panel connector module 54 with the first set of connectors 58 of the blade module 52 and likewise may be configured to align the corresponding set of connectors 64 of the second side-panel connector module 56 with the second set of connectors 60 of the blade module 52.

According to some implementations, the blade module 52 may have a relatively flat form factor and may be configured to be mounted horizontally on a rack. The blade module 52 may include a front section, a rear section, a left-side section, and a right-side section. When the blade module 52 is mounted on the rack, the front section is arranged at or near a front portion of the rack and the rear section is arranged at or near a back portion of the rack. One or more sets of connectors (e.g., the first set of connectors 58 and/or the second set of connectors 60) may be arranged in the left-side section and/or right-side section and may be configured for coupling with one or more side-plane connector modules 54, 56.

Embodiment of Reciprocating Mechanism

Figure 7:
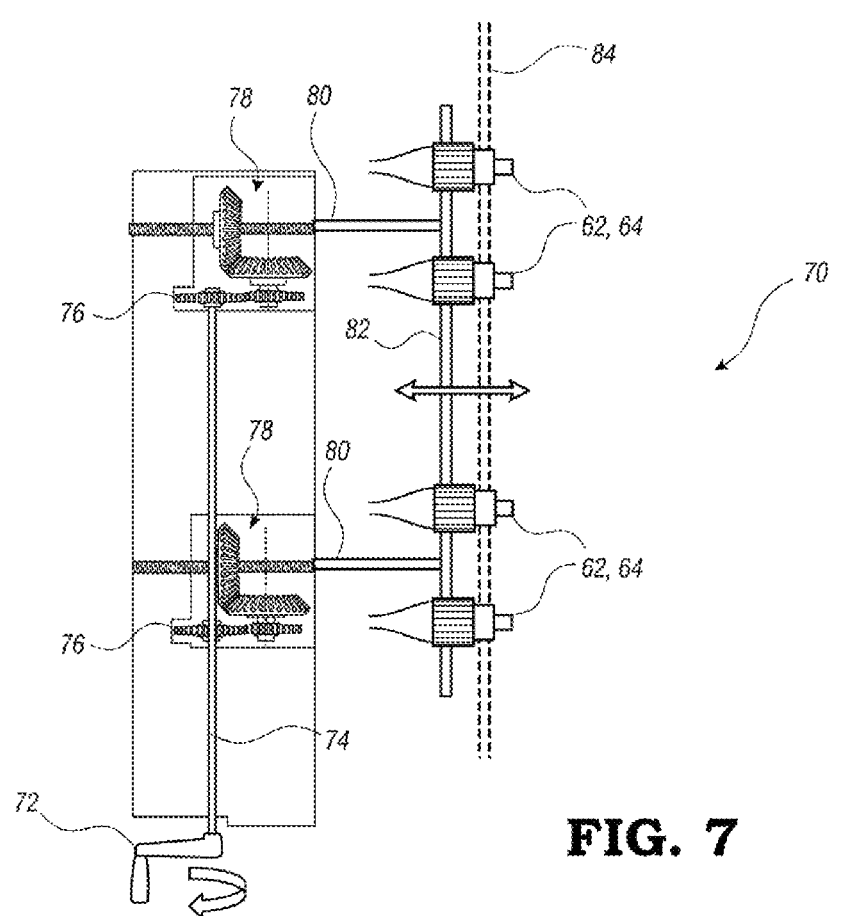
FIG. 7 is a diagram illustrating a reciprocating mechanism of one of the side-panel connector modules shown in FIG. 6, according to various embodiments.

FIG. 7 is a diagram illustrating an embodiment of a reciprocating mechanism 70 that may be arranged within an interior of one of the side-panel connector modules 54, 56 shown in FIG. 6. In the embodiment shown in FIG. 7, the reciprocating mechanism 70 includes a crank 72 connected to a rod 74 that may be able to rotate about its longitudinal axis by the crank 72. The rod 74 is configured to rotate one or more gears of one or more gear assemblies 78. The one or more gear assemblies 78 are configured to cause one or more threaded shafts 80 to reciprocate is a side-to-side direction orthogonal to a front-to-back direction of the blade module 52. The threaded shafts 80 are connected to a panel 82 that supports the corresponding set of connectors 62, 64.

In operation, when the crank 72 is turned in one direction (e.g., clockwise), the corresponding set of connectors 62, 64 is extended further beyond an outer wall 84 of the side-panel connector module 54, 56 directed towards the blade module 52. When extended to a certain extent, the corresponding set of connectors 62, 64 is configured to make contact with and/or engage with the first or second set of connectors 58, 60 of the blade module 52. On the other hand, when the crank 72 is turned in the other direction (e.g., counterclockwise), the corresponding set of connectors 62, 64 is retracted within the outer wall 84 directed away from the blade module 52. When retracted to a certain extent, the corresponding set of connectors 62, 64 is configured to disengage from and/or break contact with the first or second set of connectors 58, 60 of the blade module 52. The connectors of the blade module 52 and first and second side-plane connector modules 54, 56 are configured to engage each other respectively using a blind-mating connection, which may include a snap-on or plug-in action where no tools are needed. For example, the blind-mating connectors may include Expanded Beam Optics (EBO) connectors or other suitable type of connectors.

Therefore, after the blade module 52 is inserted into a slot of the rack and rigidly attached, the reciprocating mechanism 70 of the first side-plane connector module 54 is actuated to retract the corresponding set of connectors 62. Then, the first side-plane connector module 54 can be installed on the blade module 52, which may include aligning the connectors using the alignment mechanisms 66. At this point, the corresponding set of connectors 62 are positioned by a certain distance away from the first set of connectors 58. Then, the installer may turn the crank 72 to cause the corresponding set of connectors 62 to move towards the first set of connectors 58 until contact is made and/or the connectors are engaged. Next, the second side-plane connector module 56 may be installed in the same manner. To remove each of the first and side-plane connector modules 54, 56, the reverse process is performed.

Those skilled in the art will recognize the reciprocating mechanism 70 is an example mechanical approach for blind-mate connectivity and other approaches are also contemplated, including different mechanical approaches as well as electronic approaches, such as via motors, etc.

NE assembly

According to various implementations of the present disclosure, the NE assembly 50 may include the blade module 52 having a relatively flat form factor. For example, the blade module 52 may include at least a front section, a rear section, a left-side section, and a right-side section. When the blade module 52 is mounted horizontally on a rack, the front section thereof is arranged at or near a front portion of the rack and the rear section thereof is arranged at or near a back portion of the rack. The NE assembly 50 may also include a first side-plane connector module 54 configured to be coupled with the left-side section or right-side section of the blade module 52.

In some embodiments, the NE assembly 50 may further include a second side-plane connector module 56, wherein the first side-plane connector module 54 is configured to be coupled with the left-side section of the blade module 52 and the second side-plane connector module 56 is configured to be coupled with the right-side section of the blade module 52. When coupled with the blade module 52, the first side-plane connector module 54 may be configured to extend beyond a left-side portion of the rack and the second side-plane connector module 56 may be configured to extend beyond a right-side portion of the rack.

The blade module 52 may further include a first set of connectors 58 arranged in the left-side section thereof and a second set of connectors 60 arranged in the right-side section thereof. The first set of connectors 58 are configured for connection with a first corresponding set of connectors 62 of the first side-plane connector module 54 and the second set of connectors 60 are configured for connection with a second corresponding set of connectors 64 of the second side-plane connector module 56. The NE assembly 50 may further include an alignment structure 66 for aligning the first corresponding set of connectors 62 of the first side-plane connector module 54 with the first set of connectors 58 of the blade module 52 when the first side-plane connector module 54 is being coupled with the blade module 52 and for aligning the second corresponding set of connectors 64 of the second side-plane connector module 56 with the second set of connectors 60 of the blade module 52 when the second side-plane connector module 56 is being coupled with the blade module 52.

The first and second side-plane connector modules 54, 56 may each further include an additional set of connectors configured for connection with a plurality of external fiber optic cables, wherein the additional sets of connectors are configured to communicate with the corresponding sets of connectors 62, 64 via optical fibers within a housing of the respective side-plane connector module 54, 56. The various connectors 58, 60, 62, 64 may be configured for connection using blind-mate connections, Multi-fiber Push Ons (MPOs), and/or Expanded Beam Optics (EBO) connections.

The first and second side-plane connector modules 54, 56 may each include a reciprocating mechanism (e.g., reciprocating mechanism 70). When the respective side-plane connector module 54, 56 is coupled with the left-side section or right-side section of the blade module 52, the reciprocating mechanism 70 is configured to extend the connectors toward the blade module 52 or retract them away from the blade module 52. In some embodiments, the reciprocating mechanism 70 may include a crank 72 and a gear assembly 78. For example, the crank 72 may be arranged at a front portion of the respective side-plane connector module 54, 56 for easy access by an installer.

According to additional implementations, the blade module 52 may further include an enclosure that houses one or more of fiber management, optical circuit switches, Application-Specific Integrated Circuits (ASICs), Graphical Processing Units (GPUs), Central Processing Units (CPUs), and Tensor Processing Units (TPUs). The blade module 52 may include a pizza box configuration and may fit within one Rack Unit (1 RU) of the rack. The blade module may be configured as a Network Element (NE), an Internet switch, a router, a computing system, a server, a rack server, a blade server, an Ethernet blade, a leaf blade, or a spine blade. In some embodiments, the NE assembly may further include a shared blade enclosure configured to be mounted on the rack, wherein the shared blade enclosure includes a plurality of slots configured to slidably accommodate a plurality of blade modules. The rack, for instance, may be arranged in a data center having a plurality of other racks.

In some embodiments, the blade module 52 may further include a set of front connectors arranged in the front section and configured for connection with a plurality of pluggable modules. The front section of the blade module 52, in some implementations, may include three face panels 32, 34, 36 oriented at different angles with respect to each other. The NE assembly 50, along with other NE assemblies mounted on a single rack, may further include a liquid cooling system arranged near the rear section. The blade module 52 may also include a set of rear connectors arranged in the rear section and configured for connection with intra-rack fiber optic cables and/or inter-rack fiber optic cables.

Data Center Management

Figure 8:
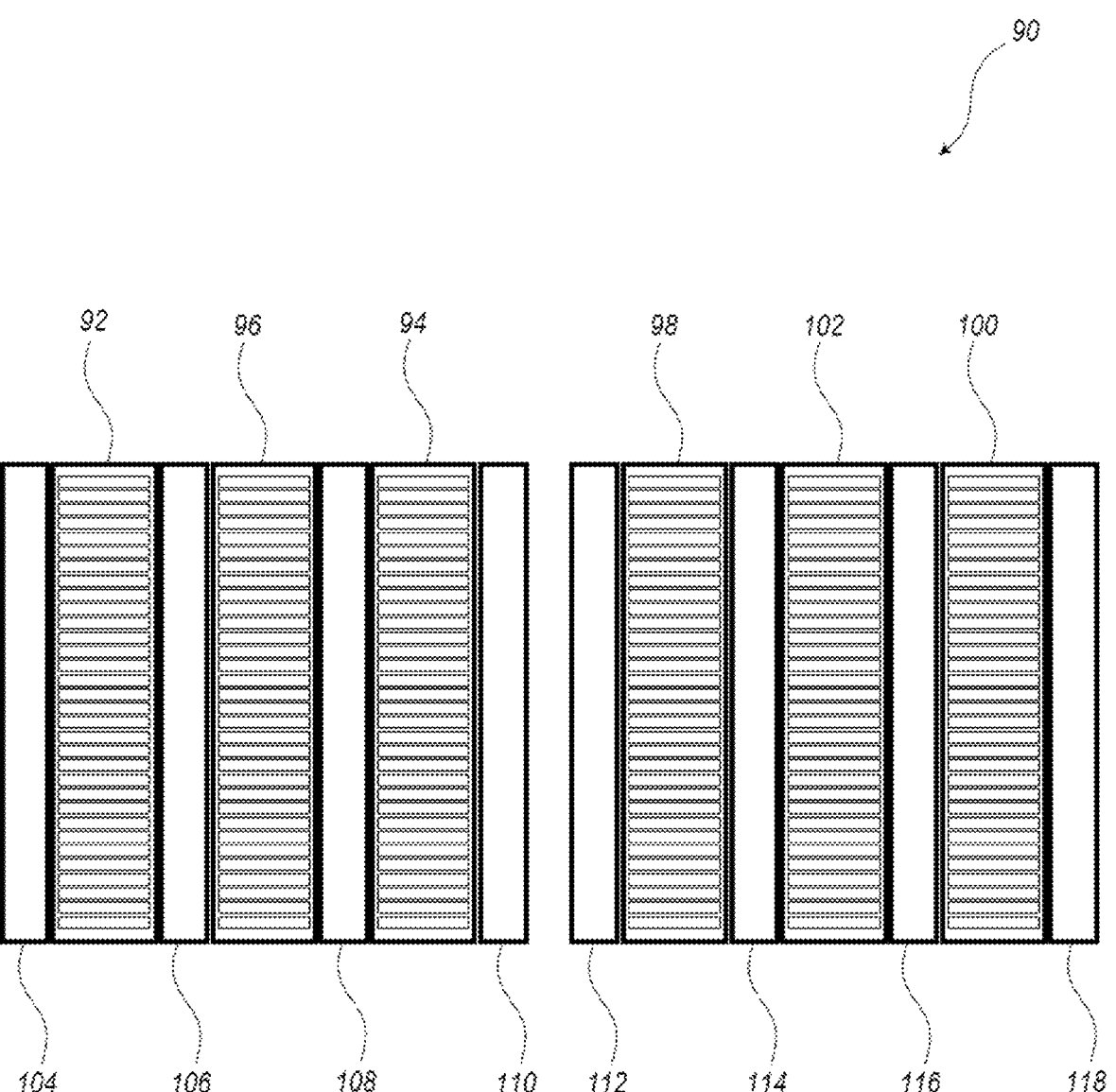
FIG. 8 is a diagram illustrating a front view of a portion of a data center including a plurality of racks, blade modules, and banks of side-panel connector modules, according to various embodiments.

FIG. 8 is a diagram illustrating a front view of an area 90 of a Data Center. As shown in this embodiment, the area 90 of the Data Center includes a plurality of racks, blade modules, and banks of side-panel connector modules. In one portion, leaf racks 92, 94 may be positioned on opposite sides of a spine rack 96. In another portion, the same arrangement may be used where leaf racks 98, 100 may be positioned on opposite sides of another spine rack 102. Each rack 92, 94, 96, 98, 100, 102 may include a plurality of slots (e.g., slots 1-32) for accommodating a plurality of NEs or blades. Also, according to some embodiments, banks 104, 106, 108, 110, 112, 114, 116, 118 of side-plane connector modules may be arranged on either or both sides of the racks 92, 94, 96, 98, 100, 102. It may be noted that when banks of side-plane connector modules are arranged between the racks, the racks are separated by at least a certain distance, thereby allowing optical fiber and/or other cables to be run from one rack to another.

Figures 9, 10:
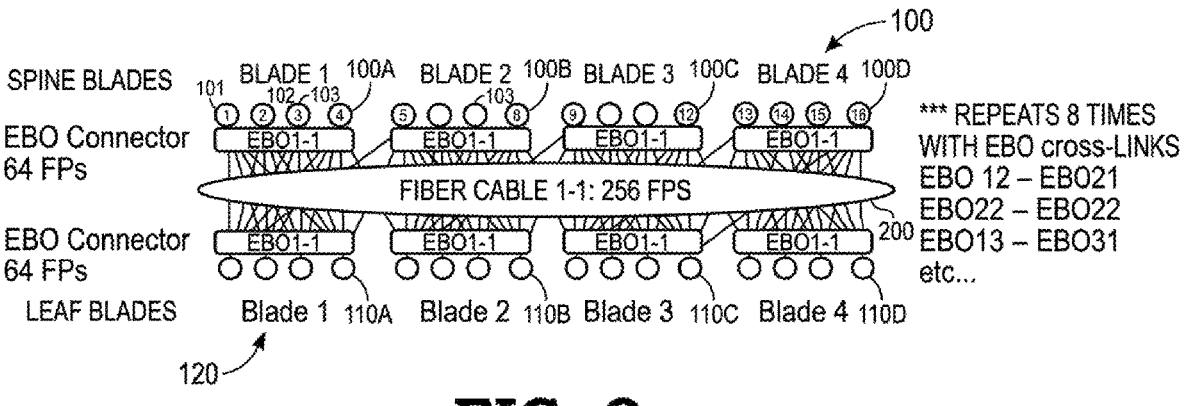
FIGS. 9 and 10 are diagrams illustrating interconnections among a plurality of blade modules on adjacent racks, according to various embodiments.

FIGS. 9 and 10 are diagrams illustrating embodiments of interconnections among a plurality of blade modules on adjacent racks. In FIG. 9, four blades of one or more spine blades are arranged for connection with four blades of one or more leaf blades. Each blade may include connectors (e.g., EBO connectors) arranged in a fiber cable having 256 fiber pairs.

From the perspective of the spine blades, Spine Ethernet ASICs (circles) aggregate 16 ports each into a bundle directed to a single EBO connector (labelled "EBO1-1"). Each EBO connector provides 64 fiber-pairs=4 ASICs*16 ports from each Spine ASIC. Fibers from four EBO connectors are aggregated into a single structured fiber cable, interchanged internally to the cable, and connected to corresponding four EBO connectors on the opposite end, providing connections from each Spine ASIC to 16 Leaf ASICS.

This arrangement repeats 8 times per Spine blade to provide 16*8=128 individual port connections to 128 Leaf ASICs in a Leaf Rack. There are 8 structured cables connecting each four-blade set in the Spine rack to each Leaf rack. Therefore, there are 8 EBO connectors in a row on a Spine blade, providing fan-out to a single Leaf rack. The arrangement has a total of 8*8=64 structured cables with 256 fiber-pairs each providing full connectivity from a Spine rack to a single Leaf rack.

Four of such EBO rows may be included to provide full connectivity from each Spine blade to all four-Leaf racks for a total of 32 EBO connectors (each with 64 fiber-pairs). There may be two rows on each side of the Spine Blade. There may be a single structured fiber cable 1-1:256 FPs with four EBO connectors per end (EBO 1-1), each EBO providing individual fiber-pairs per port to Ethernet ASICs (circles).

Similarly, eight EBO connector rows exist on each Leaf blade. However, since each Leaf blade is connected to only two Spines, only two rows may be needed per Leaf blade dedicated to Spines. The other Leaf ports may be dedicated to Client facing connections. These may be brought out to side-plane connector modules using EBO blind-mate connectors, to faceplate connectors, to faceplate pluggable sockets, or combinations thereof.

The arrangement of a single eight-EBO connector row is shown in more detail with respect to FIG. 10. Each "fiber cable" attaches to four EBO connectors across four Blades on each side. The fiber cables are identical in interchange design, but connections can be cross-linked, such that a second four-set of Spine blades connects to a second column of 1st Leaf 4-set; 3rd 4-set of Spine blades connects to 3rd column of 1st Leaf 4-set; etc.

Thus, a complete fan-out interchange may be achieved from Spine Rack to the ASICs within a single Leaf rack. The same Row structure may be repeated four times to achieve Spine fan-out to all four-Leaf racks.

All EBO connectors on a side-plane connector module (facing towards a single blade) can be positioned on a single mechanical carrier structure for simultaneous engagement/ disengagement from the corresponding blade connectors. Therefore, connections can be established on a per-blade basis, allowing for independent removal and insertion of blades.

In FIG. 10, the arrangement includes a single EBO connector row (8 EBOs) per Blade. Each Blade may include four such rows. There may be 64 structured cables, each with 4 EBO connectors per end providing connectivity from a Spine to non-adjacent Leaf (e.g., as shown in FIG. 8).

Those skilled in the art will appreciate the embodiments of FIGS. 9 and 10 are an example implementation and the present disclosure contemplates other bulk cabling approaches consistent with the side interconnect approach described herein.

Process for Installing a NE Assembly

FIG. 11 is a flow diagram illustrating an embodiment of a process 140 for installing a NE assembly (e.g., NE assembly 50) on a rack. As shown in FIG. 11, the process 140 includes a step of sliding a blade module in a front-to-rear direction within a slot of the rack, as indicated in block 142. The process 140 also includes a step of physically coupling a first side-plane connector module to a side section of the blade module, as indicated in block 144. According to some embodiments, the process 140 may further include a step of actuating a reciprocating mechanism of the first side-plane connector module to move a set of connectors of the first side-plane connector module in a direction orthogonal to the front-to-rear direction to cause the set of connectors to contact a corresponding set of connectors on a side section of the blade module, as indicated in block 146.

Additional Considerations

The systems and methods of the present disclosure provide blind-mate connectors on the sides of each blade (in addition to the conventional one on the back). Optical connectors may be implemented using high-density connectors with low insertion force (e.g., Expanded Beam Optics (EBO) from 3M). The arrangement also provides a free-moving bank of connectors within the inter-rack space, on a per-blade basis. The banks 104, 106, 108, 110, 112, 114, 116, 118 of connectors may be actuated and engaged from the front, the rear, or the sides. They also provide pre-assembled structures to provide connection inter-change required for a specific inter-rack connection configuration. The embodiments are described as structured cabling, but flex circuits or other methods can also be envisioned.

The embodiments described herein provide various points of novelty with respect to conventional systems. For example, the embodiments may include side-oriented blind-mate connectors, free-floating blind-mate connector banks that are externally actuated and engaged to the fixed blade, and associated cabling structured to provide required inter-change of connections As a result of deploying such systems and methods of the present disclosure, some benefits may include much larger real estate available for IO blind-mates on the sides, which can thereby handle much larger IO scale. Also, this may result in much easier handling of fiber and more direct connection to adjacent racks. Other benefits include easier access to IO cables for repair and/or replacement, frees up real estate on back panel for Liquid Cooling, power, etc., easier access to Liquid Cooling connectors and pipes for repairs, etc., additional free flow area for possible air cooling vents and fans on front and rear panels for cooling components that are not on Liquid Cooled cold plates, easier and more flexible layouts of IO modules and cables inside the blade, etc. Also, if front-panel plugs are eliminated, the present disclosure can provide much easier blade installation/removal for repairs, etc. and can provide highly differentiated, efficient, multi-rack architecture.

NEs described herein may include Ethernet switch ASICs. Other configurations and uses are also possible, such as, for example, using Optical Circuit switches, GPUs, CPUs, TPUs, or any other component that requires massive external IO bandwidth. Configurations may also use optical blind-mates and fiber cables. However, in some embodiments, electrical blind-mates, such as from Amphenol, TE Connectivity, etc., can also be used.

In some embodiments, blade connectors may be rigidly attached to the blade box, although, in other embodiments, there may be some provisions for a floating arrangement to accommodate some amount of misalignment. Optical IOs may be positioned throughout the blade (not shown) such that these modules provide full per-port granularity of fiber connections. Assuming a reasonable industry trajectory to deliver 3.2 Tb optical modules providing 16×200 Gb ports per fiber pair, some system may use 32 such modules per ASIC or 128×3.2 Tb modules per blade.

Each ASIC may consume about 700 W of power, while an optical module may be about 16 W (6 pJ/bit), for a total blade power of about 4900 W. Such power, while high, is within current industry capability assuming Liquid Cooling.

Side-plane connector modules may incorporate blind-mate connectors that are positioned in a ganged fashion on a single mechanical carrier. These connectors may be provided on independent carriers, on a per blade basis, thus allowing for independent deployment of individual blades. Carriers may be provided with a mechanical mechanism for lateral movement. The connectors may be mechanically retracted during blade insertion/removal. Once the blade is properly engaged in the rack, the side-plane connector modules or carriers may be mechanically moved to engage its connectors with corresponding connectors on the blade.

The reciprocating mechanism 70 of FIG. 7 includes one of many possible implementations for moving connectors in and out of contact with each other. The reciprocating mechanism 70 may include a threaded screw-based arrangement which provides for good alignment, insertion force control, and reliability. Other configurations may provide similar functionality, including levers, latches, built-in motors for automatic actuation, etc. Also included are alignment structures 66 or other coarse-alignment guide rails and pins on the side plate, which can reduce the capture range of the per-connector guidance mechanism. The connectors can additionally have a floating arrangement in X-Y-Z directions that can be part of the connectors to part of the side-plane.

An example dense connector (144 fibers) with Expanded Beam Optics for dust tolerance, low insertion force, and low optical loss may be used for some or all connections. However, other optical and electrical connectors may be implemented as well. For connectors that need cleaning, a special cleaning blade can be used for the optical blind-mate connectors.

A complete, fully populated Leaf/Spine fabric may include 32 Ethernet blades per rack. Thus, the Leaf layer may include four racks, while the Spine layer may include two racks, as shown in FIG. 8. This provides a total system of 6*32*4=768 Ethernet switch ASICs, which can be arranged as shown. Again, side-racks or side-plane connector modules may be provided both in direct connection between adjacent Ethernet racks as well as connections to racks further away. Additional fiber links (not shown in FIG. 8) may provide connections between racks that are not directly adjacent.

The Leaf/Spine fabric of the embodiment shown in FIG. 8 may provide 32768×800 G client ports. Side-racks or side-plane connector modules may provide direct adjacent rack connectivity. This system may include more details on the exact connector and cabling configuration for a specific network. Positioning four Ethernet ASICs (512 ports each) on a single blade may require 4096 total IO fibers per blade. Thus, the systems described herein can make use of high-capacity blind-mate connectors as well as machine-made structured cabling.

The implementations described herein provide systems that allow a network operator or technician to manage a large number of fiber strands and connectors, particularly in a network environment in which the scale has reached the point where an operator essentially runs out of the back plane space and front panel space. The systems described herein provide a way to use the sides of these boxes in addition to the front and back. Also, by accessing the space on the sides of racks, where there is more real estate, a network technician can have more space on the sides of these boxes for running cables and making connections, particularly between adjacently positioned leaf and spine racks. This provides easier access to internal components and allows for shorter traces. Also, with the extra space, this can also result in better air flow around the network components.

Conclusion

Those skilled in the art will recognize that the various embodiments may include processing circuitry of various types. The processing circuitry might include, but are not limited to, general-purpose microprocessors; Central Processing Units (CPUs); Digital Signal Processors (DSPs); specialized processors such as Network Processors (NPs) or Network Processing Units (NPUs), Graphics Processing Units (GPUs); Field Programmable Gate Arrays (FPGAs); or similar devices. The processing circuitry may operate under the control of unique program instructions stored in their memory (software and/or firmware) to execute, in combination with certain non-processor circuits, either a portion or the entirety of the functionalities described for the methods and/or systems herein. Alternatively, these functions might be executed by a state machine devoid of stored program instructions, or through one or more Application-Specific Integrated Circuits (ASICs), where each function or a combination of functions is realized through dedicated logic or circuit designs. Naturally, a hybrid approach combining these methodologies may be employed. For certain disclosed embodiments, a hardware device, possibly integrated with software, firmware, or both, might be denominated as circuitry, logic, or circuits "configured to" or "adapted to" execute a series of operations, steps, methods, processes, algorithms, functions, or techniques as described herein for various implementations.

Additionally, some embodiments may incorporate a non-transitory computer-readable storage medium that stores computer-readable instructions for programming any combination of a computer, server, appliance, device, module, processor, or circuit (collectively "system"), each potentially equipped with one or more processors. These instructions, when executed, enable the system to perform the functions as delineated and claimed in this document. Such non-transitory computer-readable storage mediums can include, but are not limited to, hard disks, optical storage devices, magnetic storage devices, Read-Only Memory (ROM), Programmable Read-Only Memory (PROM), Erasable Programmable Read-Only Memory (EPROM), Electrically Erasable Programmable Read-Only Memory (EEPROM), Flash memory, etc. The software, once stored on these mediums, includes executable instructions that, upon execution by one or more processors or any programmable circuitry, instruct the processor or circuitry to undertake a series of operations, steps, methods, processes, algorithms, functions, or techniques as detailed herein for the various embodiments.

While the present disclosure has been detailed and depicted through specific embodiments and examples, it is to be understood by those skilled in the art that numerous variations and modifications can perform equivalent functions or yield comparable results. Such alternative embodiments and variations, which may not be explicitly mentioned but achieve the objectives and adhere to the principles disclosed herein, fall within its spirit and scope. Accordingly, they are envisioned and encompassed by this disclosure, warranting protection under the claims associated herewith. That is, the present disclosure anticipates combinations and permutations of the described elements, operations, steps, methods, processes, algorithms, functions, techniques, modules, circuits, etc., in any manner conceivable, whether collectively, in subsets, or individually, further broadening the ambit of potential embodiments. Also, in the claims, the terms "comprise," "comprises," "comprising," "include," "includes," and "including" are intended to be non-limiting and open-ended. These terms specifically list essential elements or steps but do not exclude additional elements or steps. This applies even when a claim or series of claims includes more than one of these terms.

What is claimed is:

1. A Network Element (NE) assembly comprising:
   a blade module having a relatively flat form factor, the blade module comprising at least a front section, a rear section, a left-side section, and a right-side section, wherein, when the blade module is mounted in a rack, the front section thereof is arranged at or near a front portion of the rack and the rear section thereof is arranged at or near a back portion of the rack; and
   a first side-plane connector module comprising a housing carrying a plurality of blind-mate connectors and configured to be physically attached to the left-side section or right-side section of the blade module after the blade module is mounted in the rack, the blind-mate connectors being configured to laterally engage corresponding connectors on the blade module to provide external interconnectivity routed through the housing.

2. The NE assembly of claim 1, further comprising a second side-plane connector module, wherein the first side-plane connector module is configured to be coupled with the left-side section of the blade module and the second side-plane connector module is configured to be coupled with the right-side section of the blade module to provide side-oriented blind-mate interconnections on both sides of the blade module.

3. The NE assembly of claim 2, wherein, when coupled with the blade module, the first side-plane connector module is configured to extend beyond a left-side portion of the rack and the second side-plane connector module is configured to extend beyond a right-side portion of the rack such that external cable bundles are routed outside the rack boundaries along the respective modules.

4. The NE assembly of claim 1, wherein the blade module further comprises a first set of connectors arranged in the left-side section or right-side section thereof, the first set of connectors configured for connection with a first corresponding set of connectors of the first side-plane connector module via a blind-mate side-plane interface formed between the blade module and the housing of the first side-plane connector module.

5. The NE assembly of claim 4, further comprising an alignment structure including alignment rails, guide pins, or protrusions for aligning the first corresponding set of connectors of the first side-plane connector module with the first set of connectors of the blade module when the first side-plane connector module is being coupled with the blade module.

6. The NE assembly of claim 1, wherein the first side-plane connector module further comprises an additional set of connectors arranged on an outer plate of the housing configured for connection with a plurality of external fiber optic cables, the additional set of connectors configured to communicate with a corresponding set of connectors on the blade module via optical fibers or electrical conductors routed within the housing of the first side-plane connector module.

7. The NE assembly of claim 4, wherein the first set of connectors and the first corresponding set of connectors are configured to be connected using blind-mate connections, Multi-fiber Push On (MPOs) connections, and/or Expanded Beam Optics (EBO) connections.

8. The NE assembly of claim 4, wherein the first set of connectors and the first corresponding set of connectors are connected in a given structure including a carrier structure supporting multiple connectors simultaneously, such that an external cable from the first side-plane connector module connected to a connector of the first set of connectors supports the given structure for connectivity to another NE assembly.

9. The NE assembly of claim 1, wherein the first side-plane connector module includes one or more connectors and a reciprocating mechanism arranged within the housing of the module and configured to move a connector carrier laterally toward or away from the blade module, and wherein, when the first side-plane connector module is coupled with the left-side section or right-side section of the blade module, the reciprocating mechanism is configured to extend the one or more connectors toward the blade module or retract the one or more connectors away from the blade module.

10. The NE assembly of claim 9, wherein the reciprocating mechanism includes a crank and a gear assembly, and wherein the crank is arranged at a front portion of the first side-plane connector module.

11. The NE assembly of claim 1, wherein the blade module further comprises an enclosure that houses one or more of fiber management, optical circuit switches, Application-Specific Integrated Circuits (ASICs), Graphical Processing Units (GPUs), Central Processing Units (CPUs), and Tensor Processing Units (TPUs).

12. The NE assembly of claim 1, wherein the blade module includes a pizza box configuration and fits in one Rack Unit (1 RU) of the rack.

13. The NE assembly of claim 1, wherein the blade module is configured as a Network Element (NE), an Internet switch, a computing system, a router, a server, a rack server, a blade server, an Ethernet blade, a leaf blade, or a spine blade.

14. The NE assembly of claim 1, further comprising a shared blade enclosure configured to be mounted on the rack, wherein the shared blade enclosure includes a plurality of slots configured to slidably accommodate a plurality of blade modules each configured for side-plane interconnection with respective side-plane connector modules.

15. The NE assembly of claim 1, wherein the rack is arranged in a row in a data center having a plurality of other racks.

16. The NE assembly of claim 1, wherein the blade module further comprises a set of front connectors arranged in the front section thereof and configured for connection with a plurality of pluggable modules while side-plane connector modules provide additional side-oriented interconnectivity.

17. The NE assembly of claim 16, further comprising a liquid cooling system arranged at the back portion of rack, wherein the blade module further comprising a set of rear connectors arranged in the rear section thereof and configured for connection with intra-rack fiber optic cables and/or inter-rack fiber optic cables such that front, rear, and side interconnect regions are provided on the blade module.

18. A blade module having a relatively flat form factor and configured to be mounted in a rack, the blade module comprising:

a front section, a rear section, a left-side section, and a right-side section, wherein, when the blade module is mounted on the rack, the front section is arranged at or near a front portion of the rack and the rear section is arranged at or near a back portion of the rack; and one or more sets of connectors arranged in the left-side section and/or right-side section and configured for coupling with one or more side-plane connector modules comprising respective housings carrying a plurality of blind-mate connectors configured to be physically attached to the left-side section and/or right-side section of the blade module after the blade module is mounted in the rack, the blind-mate connectors being configured to laterally engage the one or more sets of connectors to provide external interconnectivity routed through the respective housings.

19. A method of installing a Network Element (NE) assembly on a rack, the method comprising the steps of:

sliding a blade module in a front-to-rear direction within a slot of the rack; and physically coupling a side-plane connector module to a side section of the blade module, wherein the side-plane connector module comprises a housing carrying a plurality of blind-mate connectors, and wherein physically coupling the side-plane connector module includes attaching the housing to the side section of the blade module after the blade module is mounted in the rack such that the blind-mate connectors are positioned to laterally engage corresponding connectors on the blade module to provide external interconnectivity routed through the housing.

20. The method of claim 19, further comprising the step of actuating a reciprocating mechanism of the side-plane connector module to move a set of connectors of the side-plane connector module in a direction substantially orthogonal to the front-to-rear direction to cause the set of connectors to contact a corresponding set of connectors on a side section of the blade module.

* * * * *